United States Patent
Hsieh

(10) Patent No.: US 8,564,058 B1
(45) Date of Patent: Oct. 22, 2013

(54) SUPER-JUNCTION TRENCH MOSFET WITH MULTIPLE TRENCHED GATES IN UNIT CELL

(75) Inventor: Fu-Yuan Hsieh, New Taipei (TW)

(73) Assignee: Force MOS Technology Co., Ltd., New Taipei (TW)

( * ) Notice: Subject to any disclaimer, the term of this patent is extended or adjusted under 35 U.S.C. 154(b) by 0 days.

(21) Appl. No.: 13/568,297

(22) Filed: Aug. 7, 2012

(51) Int. Cl.
*H01L 29/06* (2006.01)
*H01L 29/423* (2006.01)
*H01L 29/78* (2006.01)

(52) U.S. Cl.
USPC ........... 257/334; 257/330; 257/331; 257/332; 257/409; 257/E29.013; 257/E29.131; 257/E29.257

(58) Field of Classification Search
USPC .......... 257/334, 332, 330, 331, 409, E29.013, 257/E29.131, E29.257
See application file for complete search history.

(56) References Cited

U.S. PATENT DOCUMENTS

| | | | |
|---|---|---|---|
| 7,601,597 B2 | 10/2009 | Takei | |
| 2006/0208334 A1* | 9/2006 | Yamauchi et al. | 257/491 |
| 2009/0079002 A1* | 3/2009 | Lee et al. | 257/355 |
| 2011/0049614 A1* | 3/2011 | Gao et al. | 257/328 |
| 2011/0053326 A1* | 3/2011 | Gao et al. | 438/270 |
| 2012/0061754 A1* | 3/2012 | Hsieh | 257/331 |
| 2012/0074489 A1* | 3/2012 | Hsieh | 257/330 |
| 2012/0146133 A1* | 6/2012 | Hirler et al. | 257/330 |
| 2012/0187477 A1* | 7/2012 | Hsieh | 257/331 |
| 2012/0211831 A1* | 8/2012 | Hsieh | 257/334 |

* cited by examiner

*Primary Examiner* — Victor A Mandala
(74) *Attorney, Agent, or Firm* — Bacon & Thomas, PLLC

(57) ABSTRACT

A super-junction trench MOSEET is disclosed for high voltage device by applying a first doped column region of first conductivity type between a pair of second doped column regions of second conductivity type adjacent to sidewalls of a pair of deep trenches in each unit cell for super-junction. Meanwhile, at least one trenched gate and multiple trenched source-body contacts are formed in each unit cell between the pair of deep trenches.

11 Claims, 26 Drawing Sheets

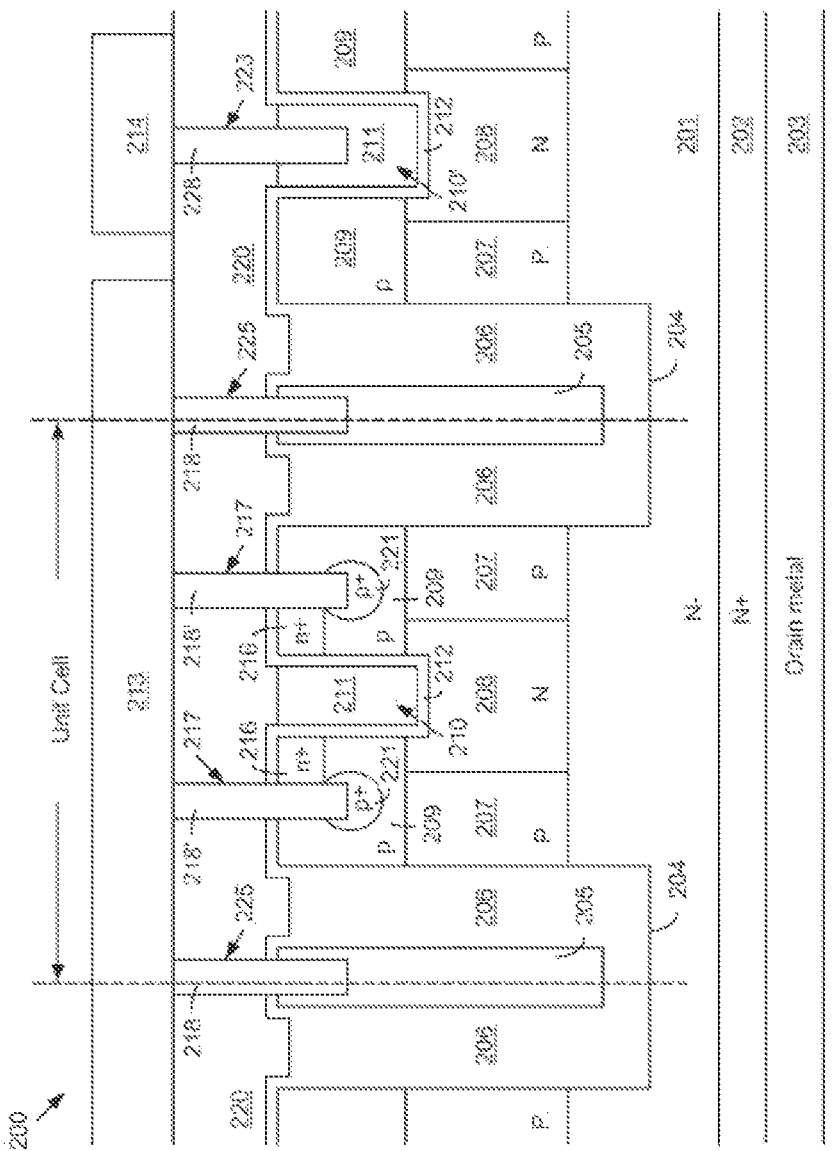

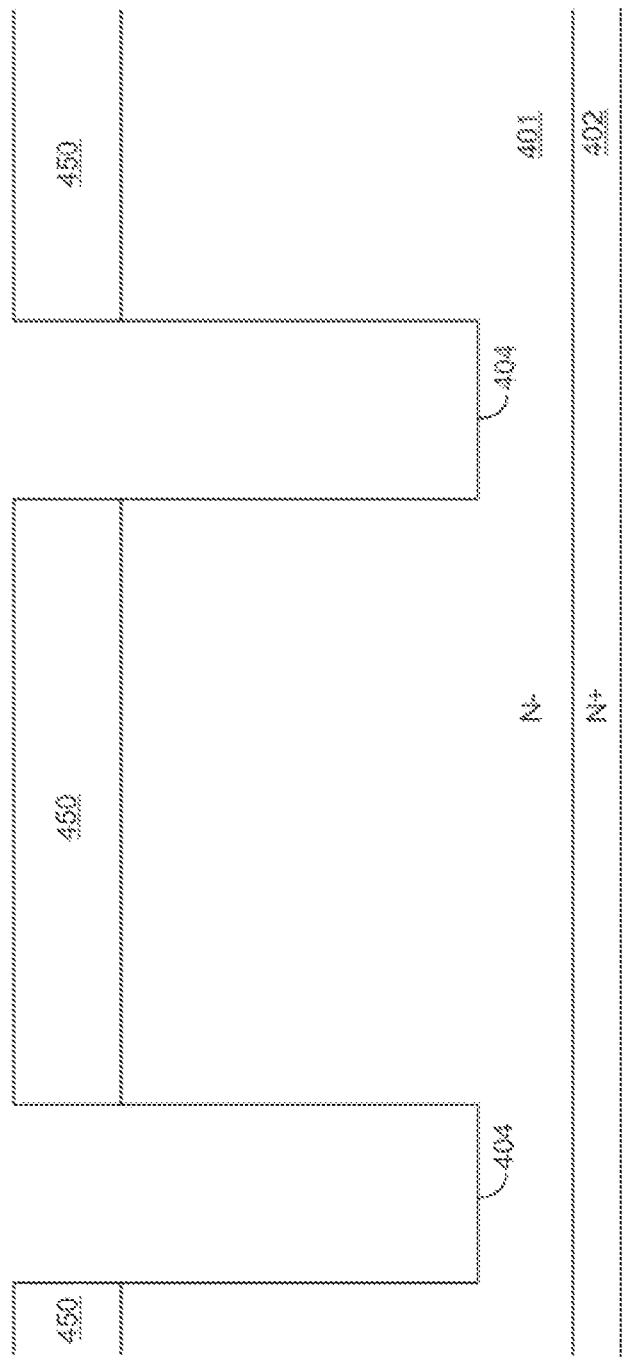

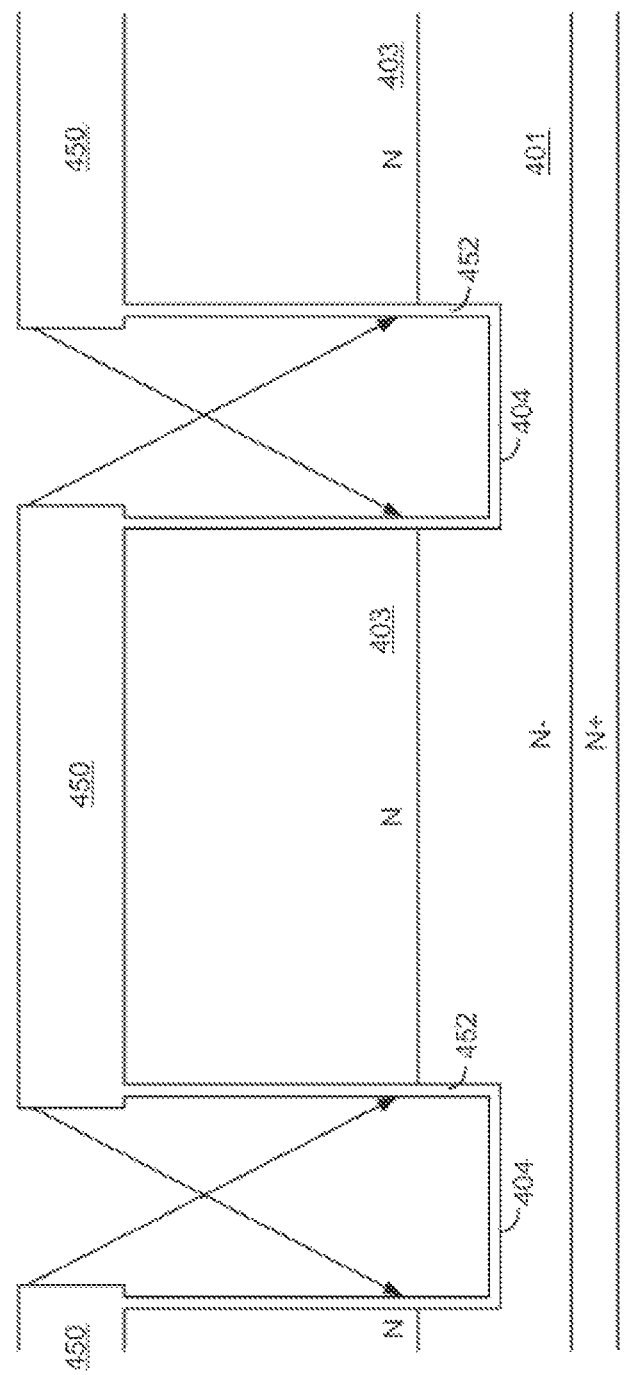

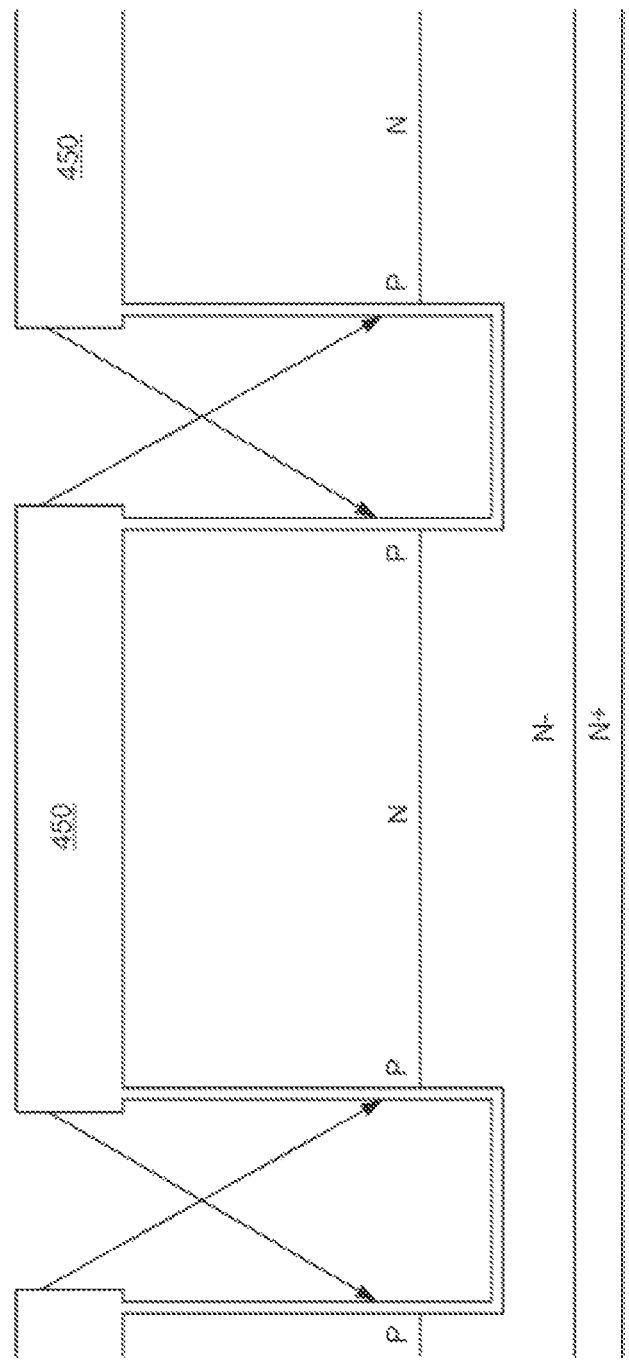

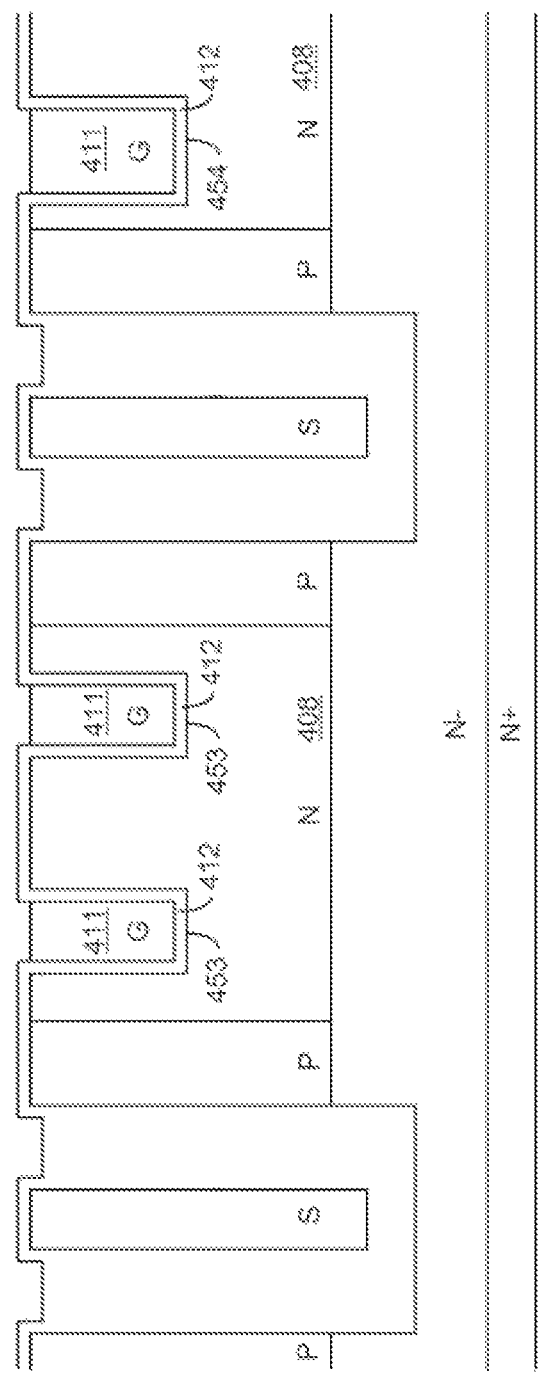

SUPER-JUNCTION TRENCH MOSFET WITH MULTIPLE TRENCHED GATES IN UNIT CELL

FIELD OF THE INVENTION

This invention relates generally to the cell structure, device configuration and fabrication process of power semiconductor devices. More particularly, this invention relates to a novel and improved cell structure, device configuration and improved process of a super-junction trench metal oxide semiconductor field effect transistor (MOSFET, the same hereinafter).

BACKGROUND OF THE INVENTION

Compared to the conventional trench MOSFETs, super-junction trench MOSFETs are more attractive due to higher breakdown voltage and lower specific Rds (drain-source resistance). As is known to all, a super-junction trench MOSFET is implemented by p type column structures and n type column structures arranged in parallel and connecting to each other onto a heavily doped substrate, however, the manufacturing yield is not stable because the super-junction trench MOSFET is very sensitive to the fabrication processes and conditions such as: the p type column structures and the n type column structures dopant re-diffusion issue induced by subsequent thermal processes; trapped charges within the column structures, etc. . . . All that will cause a hazardous condition of charges imbalance to the super-junction trench MOSFETs. More specifically, these undesired influences become more pronounced with a narrower column structure width for a lower bias voltage ranging under 200V.

U.S. Pat. No. 7,601,597 disclosed a method to avoid the aforementioned p type column structure and the n type structure dopant re-diffusion issue, for example in an N-channel trench MOSFET as shown in FIG. 1A, by setting up the p type column formation process at a last step after all diffusion processes such as: sacrificial oxidation after trench etch, gate oxidation, P body region formation and n+ source region formation, etc. . . . have been finished.

However, the disclosed method of this prior art is not effective because that, firstly, the p type column structure is formed by growing an additional p type epitaxial layer in deep trenches etched in an n type epitaxial layer; secondly, an additional CMP (Chemical Mechanical Polishing) is required for surface planarization after the p type epitaxial layer is grown; thirdly, double trench etches are necessary (one for shallow trenches for trenched gates formation and another for the deep trenches for the p type column structure formation), all the increased cost is not conductive to mass production. Moreover, other factors such as: the charges imbalance caused by the trapped charges within the column structure is still not resolved.

Prior arts (paper "Industrialization of Resurf stepped oxide technology for Power Transistor", by M. A. Gajda, etc., and paper "Tunable Oxide-Bypassed Trench Gate MOSFET Breaking the Ideal Super-junction MOSFET Performance Line at Equal Column Width", by Xin Yant, etc.) disclosed device structures in order to resolve the limitation caused by the conventional super-junction trench MOSFET discussed above, as shown in FIG. 1B and FIG. 1C. Both the device structures in FIG. 1B and FIG. 1C can achieve a lower specific Rds and a higher breakdown voltage than a conventional super-junction trench MOSFET because each the epitaxial layer formed in FIG. 1B and FIG. 1C has a higher doping concentration than the conventional super-junction trench MOSFET.

Refer to FIG. 1B and FIG. 1C again, both the device structures have a deep trench with a thick oxide layer along trench sidewalls and bottoms into a drift region. Only difference is that, the device structure in FIG. 1B has a single epitaxial layer (N Epi, as illustrated in FIG. 1B) while the device structure in FIG. 1C has double epitaxial layers (Epi1 and Epi2, as illustrated in FIG. 1C, the Epi1 supported on a heavily doped substrate has a lower doping concentration than the Epi2 near a channel region.) Due to the p type column structure and the n type column structure inter-diffusion, both the device structures in FIG. 1B and FIG. 1C do not have charges imbalance issue, resolving the technical limitation caused by the conventional super-junction trench MOSFET, however, the benefit of both the device structures in FIG. 1B and FIG. 1C over the conventional super-junction trench MOSFET only pronounces at the bias voltage ranging under 200V, which means that, the conventional super-junction trench MOSFET has a lower Rds when the bias voltage is beyond 200V.

Therefore, there is still a need in the art of the semiconductor power device, particularly for super-junction trench MOSFET design and fabrication, to provide a novel cell structure, device configuration that would resolve these difficulties and design limitations.

SUMMARY OF THE INVENTION

The present invention provides a super-junction trench MOSFET with resurf stepped oxides (RSO) having additional freedom for better performance optimization and manufacturing capability by tuning a thick oxide thickness to minimize influence of the charges imbalance, trapped charges, etc. Moreover, a single epitaxial layer is required to achieve a better cost effective than the prior arts. Moreover, the present invention also provides multiple trenched gates in unit cell.

According to one aspect, the present invention features a super-junction trench MOSFET comprising a plurality of unit cells with each comprising: a substrate of a first conductivity type; an epitaxial layer of the first conductivity type onto the substrate, wherein the epitaxial layer has a lower doping concentration than the substrate; a pair of deep trenches starting from a top surface of the epitaxial layer and extending downward into the epitaxial layer, each of the deep trenches being padded by a thick dielectric layer along inner surface; a shielded electrode deposited in each of the deep trenches and close to the thick dielectric layer, and connected to a source metal via a trenched source contact filled with a contact metal plug; a mesa between the pair of the deep trenches; a first doped column region of the first conductivity type formed in the mesa; a pair of second doped column regions of a second conductivity type formed in the mesa and adjacent to sidewalls of the deep trenches, located in parallel with and surrounding the first doped column region; a body region of the second conductivity type formed in the mesa and covering a top surface of the first doped column region and the second doped column regions; at least one trenched gate starting from top surface of the mesa, penetrating through the body region and extending into the first doped column region; multiple trenched source-body contacts in the mesa, each filled with the contact metal plug, penetrating through a contact interlayer and extending into the body region; and a source region of the first conductivity type formed near the top surface of the body region, located between an upper portion of each the trenched gate and sidewalls of adjacent trenched source-body contact, wherein the source region has a higher doping concentration than the epitaxial layer.

According to another aspect, the present invention features a super-junction trench MOSFET comprising a plurality of unit cells with each comprising: a substrate of a first conductivity type; an epitaxial layer of the first conductivity type onto the substrate, wherein the epitaxial layer has a lower doping concentration than the substrate; a pair of deep trenches starting from a top surface of the epitaxial layer and extending downward into the epitaxial layer, each of the deep trenches being filled with a thick dielectric layer; a mesa between the pair of the deep trenches; a first doped column region of the first conductivity type formed in the mesa; a pair of second doped column regions of a second conductivity type formed in the mesa and adjacent to sidewalls of the deep trenches, located in parallel with and surrounding the first doped column region; a body region of the second conductivity type formed in the mesa and covering a top surface of the first doped column region and the second doped column regions; at least one trenched gate starting from top surface of the mesa, penetrating through the body region and extending into the first doped column region; multiple trenched source-body contacts in the mesa, each filled with the contact metal plug, penetrating through a contact interlayer and extending into the body region; and a source region of the first conductivity type formed near the top surface of the body region, located between an upper portion of each the trenched gate and sidewalls of adjacent trenched source-body contact, wherein the source region has a higher doping concentration than the epitaxial layer.

According to another aspect of the present invention, the super-junction trench MOSFET further comprises a trenched gate for gate connection, which is connected to a gate metal via a trenched gate contact, wherein the trenched gate for gate connection is penetrating through the body region and extending into the first doped column region without having the source region surrounded.

According to another aspect of the present invention, in some preferred embodiments, the super-junction trench MOSFET further comprises a termination area including multiple guard rings of the second conductivity type.

According to another aspect of the present invention, in some preferred embodiments, the deep trenches each having a trench bottom above the substrate and underneath a bottom surface of each of the first doped column region and the second doped column regions; in some other preferred embodiments, the deep trenches each having a trench bottom further extending into the substrate, and the first doped column region and the second doped column regions each having a bottom surface reaching the substrate.

According to another aspect of the present invention, in some preferred embodiments, there is only one trenched gate formed in each unit cell; in some other preferred embodiments, there are multiple trenched gates formed in each unit cell for further Rds reduction due to less channel resistance, and for ESD capability enhancement due to larger capacitance.

According to another aspect of the present invention, in some preferred embodiments, each the trenched gate in the unit cell comprises a doped poly-silicon layer padded by a gate oxide layer, wherein the gate oxide layer has thickness along bottom of the trenched gate equal to or thinner than along sidewalls of the trenched gate; in some other preferred embodiments, each the trenched gate in the unit cell comprises a doped poly-silicon layer padded by a gate oxide layer, wherein the gate oxide layer has thickness along the bottom of the trenched gate thicker than along sidewalls of the trenched gates.

According to another aspect of the present invention, in some preferred embodiments, the first conductivity type is N type and the second conductivity type is P type; in some other preferred embodiments, the first conductivity type is P type and the second conductivity type is N type.

The invention also features a method of making a unit cell of a super junction trench MOSFET with shielded electrode, including: (a) growing an epitaxial layer of a first conductivity type upon a heavily doped substrate of the first conductivity type; (b) forming a hard mask covering a top surface of the epitaxial layer; (c) applying a trench mask to form a pair of deep trenches by etching through the hard mask, and into the epitaxial layer or through the epitaxial layer and into the substrate by successively dry oxide etch and dry silicon etch; (d) performing an isotropic dry silicon etch in down stream plasma to eliminate the plasma damage; (e) carrying out angle ion implantation of the first conductivity type dopant and diffusion to form a first doped column region with column shape within the epitaxial layer; (f) carrying out angle ion implantation of a second conductivity type dopant and diffusion to form second doped column regions with column shape adjacent to sidewalls of the deep trenches, in parallel with and surrounding the first doped region; (g) removing the hark mask; (h) forming a thick dielectric layer in the deep trenches and covering the top surface of the epitaxial layer; (i) etching back the thick dielectric layer from the top surface of the epitaxial layer; (i) applying a gate trench mask to form at least one gate trench by etching into the second doped column regions; (k) growing a sacrificial oxide layer onto inner surfaces of the gate trench and removing the sacrificial oxide layer to eliminate the plasma damage; (l) forming a gate oxide layer along inner surface of the gate trench; (m) depositing a doped poly-silicon layer to fill the gate trench; (n) etching back the doped poly-silicon layer by CMP or plasma etch to serve as gate electrode; (o) applying a body mask onto the top surface of the epitaxial layer; (p) carrying out ion implantation of the second conductivity type dopant and diffusion to form body region; (q) removing the body mask and applying a source mask onto the top surface of the epitaxial layer; (r) carrying out ion implantation of the first conductivity type dopant and diffusion to form source region near a top surface of the body region; and (s) removing the source mask and depositing an insulation layer onto the top surface of the epitaxial layer to serve as a contact interlayer.

Preferred embodiments include one or more of the following features. When forming the thick dielectric layer, in some preferred embodiments, the method further further comprises forming the thick dielectric to fill the deep trenches; in some other preferred embodiments, the method further comprises: forming the thick dielectric layer lining the inner surfaces of the deep trenches; depositing another doped poly-silicon layer onto the thick dielectric layer to fill the deep trenches; removing the another doped poly-silicon layer from the top surface of the epitaxial layer by poly-silicon CMP or dry etch; recessing the another doped poly-silicon layer to serve as shielded electrodes within the deep trenches. The method further comprises applying a guard ring mask and carrying out ion implantation of the second conductivity type dopant and diffusion to form multiple guard rings in termination area before applying the body mask. The method further comprises applying a contact mask onto a top surface of the contact interlayer and etching contact holes by successively dry oxide etch and dry silicon etch to form contact regions; carrying out ion implantation of the second conductivity type dopant to form a plurality of body contact regions within the body regions and surrounding at least bottoms of the contact holes. The method further comprises depositing a metal layer onto the top surface of the contact interlayer and applying a metal mask followed by etching metal layer to form a source metal and a gate metal.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 2A is a cross-sectional view of a preferred embodiment according to the present invention.

FIGS. 12A~12L are a serial of side cross-sectional views for showing the processing steps for fabricating the super-junction trench MOSFET.

DETAILED DESCRIPTION OF THE EMBODIMENTS

Figure 1A:
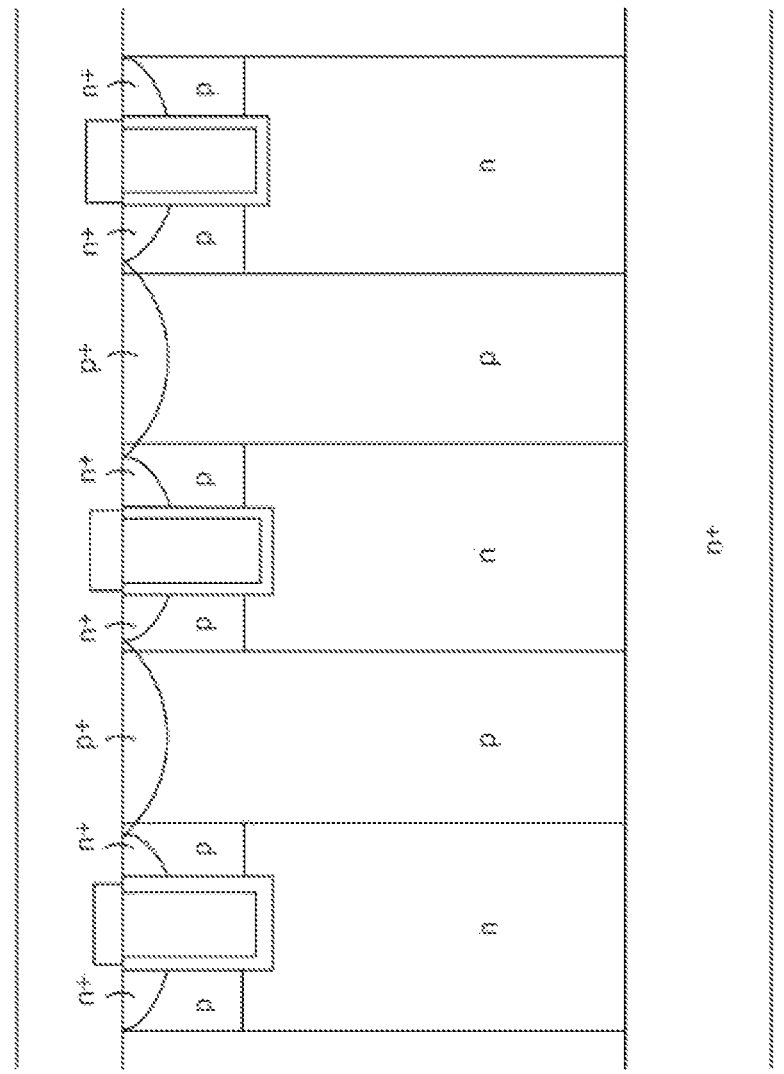
FIG. 1A is a cross-sectional view of a super-junction trench MOSFET of prior art.
Figure 1B:
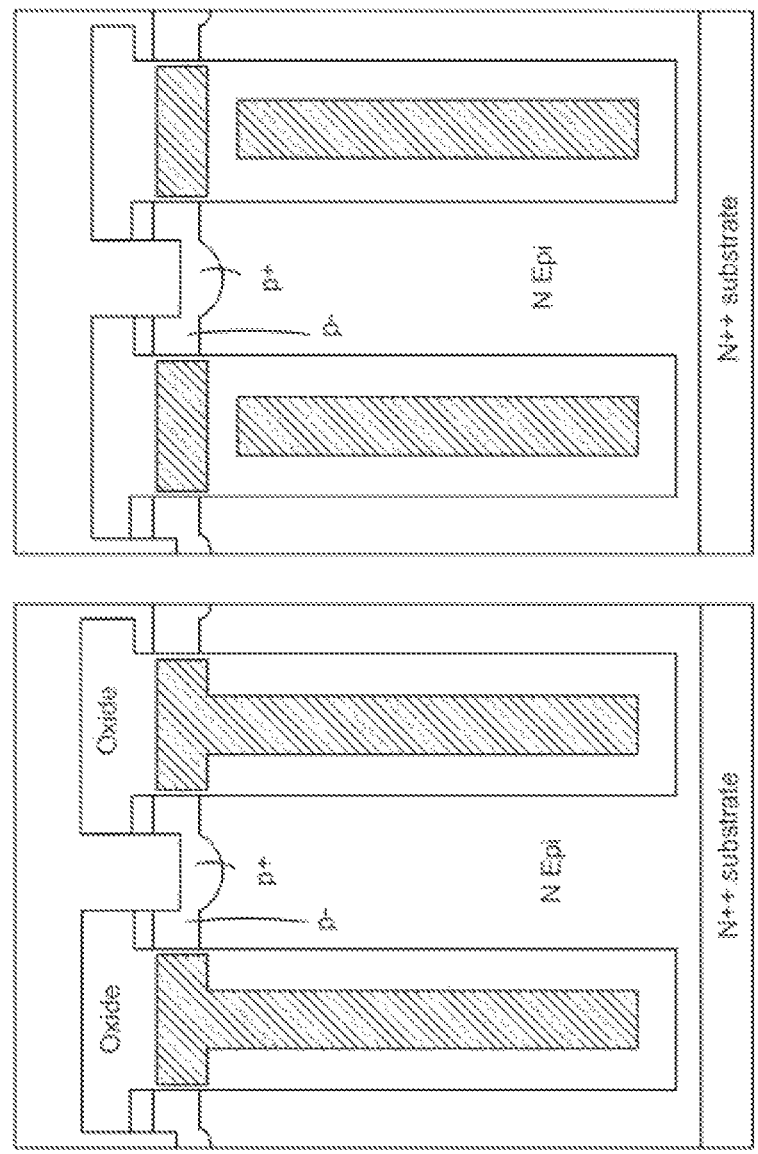
FIG. 1B is a cross-sectional view of a trench MOSFET of another prior art.
Figure 1C:
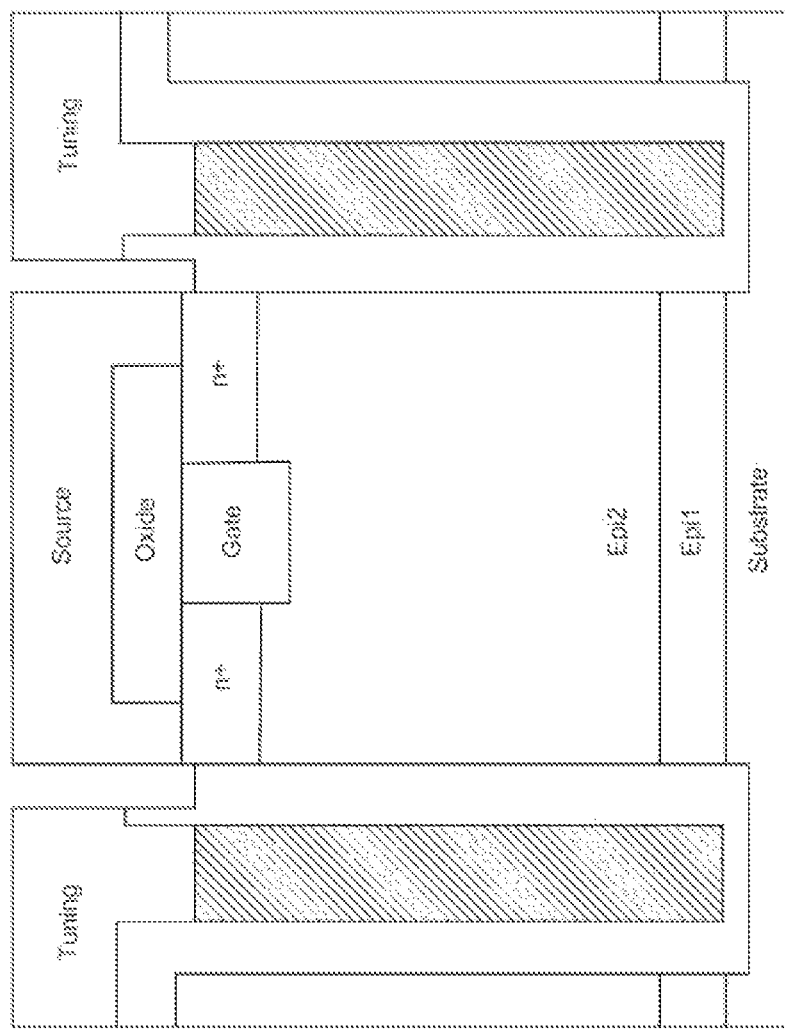
FIG. 1C is a cross-sectional view of a trench MOSFET of another prior art.

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Please refer to FIG. 2A for a preferred embodiment of this invention wherein an N-channel super-junction trench MOSFET 200 is formed in an N– epitaxial layer 201 supported onto an N+ substrate 202 which coated with a back metal 203 of Ti/Ni/Ag on its rear side as drain metal. The N-channel super-junction trench MOSFET 200 comprises a plurality of unit cells with each comprising a pair of deep trenches 204 formed starting form a top surface of the epitaxial layer 201 and vertically down extending, not reaching an interface of the epitaxial 201 and the substrate 202. Inside each of the deep trenches 204, a shielded electrode 205 padded by a thick dielectric layer 206 is formed therein. The shielded electrode 205 is connected to a source metal 213 of the trench MOSFET 200 via a trenched source contact 225 which is filled with a contact metal plug 218, penetrating through a contact interlayer 220 and extending into the shielded electrode 205. A mesa is therefore formed between the pair of the deep trenches 204 in each unit cell wherein an N first doped column region 208 is formed. Adjacent to sidewalls of the deep trenches 204, a pair of P second doped column regions 207 are formed in the mesa and in parallel surrounding with the N first doped column region 208. The N first doped column region 208 and the P second doped column regions 207 all have column bottoms above trench bottoms of the deep trenches 204. Onto a top surface of the N first doped column region 208 and the P second doped column regions 207, a p body region 209 is formed between in the mesa extending between the pair of the deep trenches. A trenched gate 210 is penetrating through the p body region 209 further extending into the N first doped column region 208 in each unit cell as shown by dashed lines, wherein the trenched gate 210 comprises a gate electrode 211 padded by a gate oxide layer 212, wherein the gate electrode 211 is further connected to a gate metal 214 of the trench MOSFET 200 by extending to a trenched gate 210' for gate connection via a trenched gate contact 223 filled with a contact metal plug 228, wherein the trenched gate 210' for gate connection has a same filling-in material as the trenched gate 210. More preferred, the trenched gate 210' for gate connection has a greater trench width than the trenched gate 210. Onto a top surface of the gate electrodes 211, the contact interlayer 220 is formed to isolate the gate electrodes 211 from the source metal 213. In each the mesa, multiple trenched source-body contacts 217 with each filled with a tungsten plug 218' are formed penetrating through the contact interlayer 220 and extending into the p body region 209 in each unit cell, and an n+ source regions 216 is formed surrounding an upper portion of the trenched gate 210, extending between the upper portion of the trenched gate 210 and sidewalls of adjacent trenched source-body contact 217. Therefore, the p body region 209 and the n+ source region 216 are connected to the source metal 213 via the multiple trenched source-body contacts 217. Furthermore, a p+ body contact region 221 is formed surrounding at least bottom of each the trenched source-body contact 217 to reduce the contact resistance between the tungsten plugs 218' and the p body region 209. In this preferred embodiment, all the contact metal plugs can be implemented by using a tungsten plug padded by a barrier metal layer of Ti/TiN or Co/TiN or Ta/TiN.

Figure 2B:
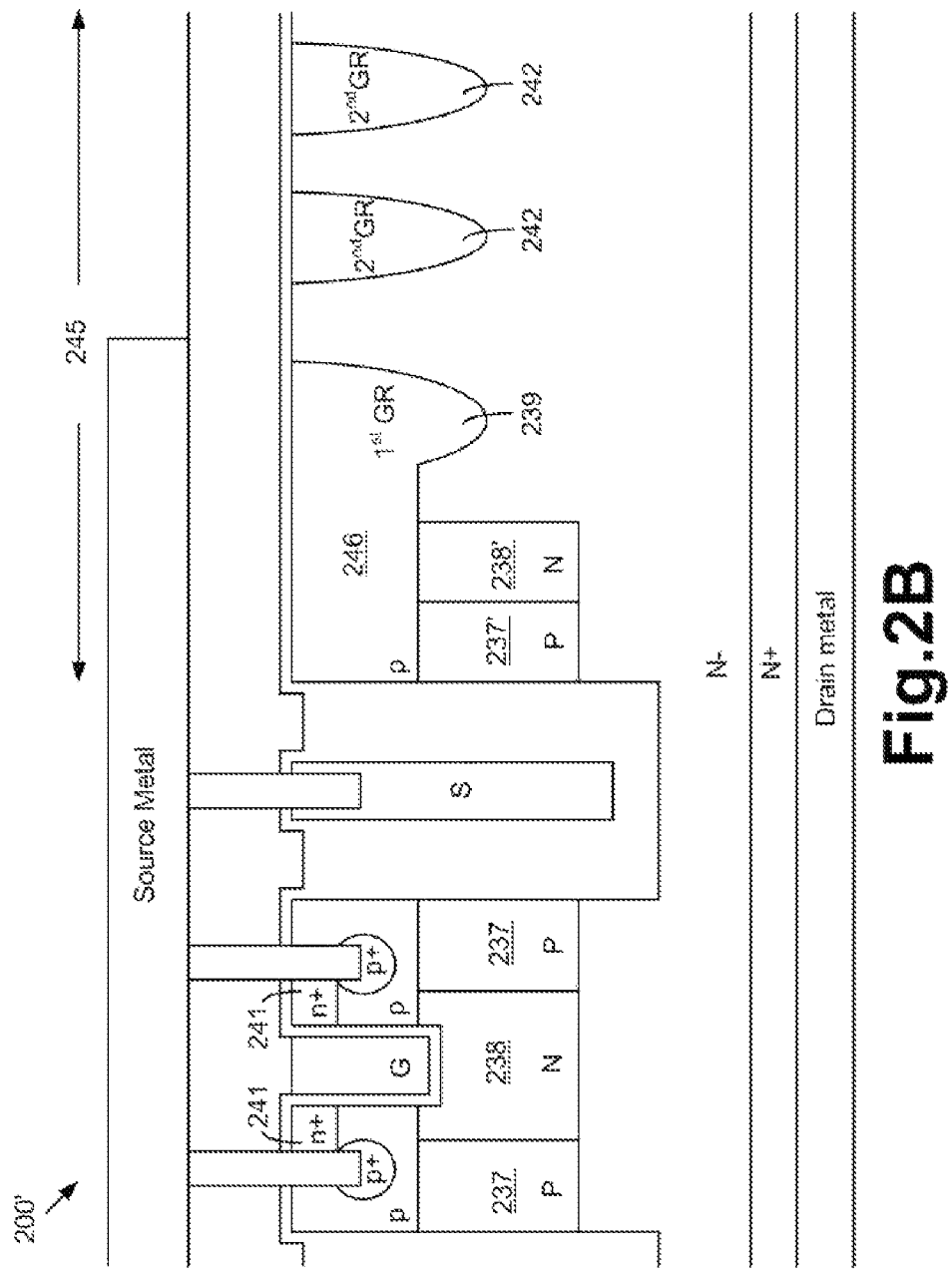
FIG. 2B is a cross-sectional view of another preferred embodiment according to the present invention.

FIG. 2B shows a cross-sectional view of another preferred super-junction trench MOSFET 200' according to the present invention which has a similar structure as the super-junction trench MOSFET 200 in FIG. 2A by having the N first doped column region 238 and the P second doped column region 237, except that, N-channel trench MOSFET 200' in FIG. 2B further comprises a termination area 245 including multiple guard rings, among which a first type guard ring 239 (1$^{st}$ GR, as illustrated in FIG. 2B) is connected with the n+ source region 241, and second type guard rings (2$^{nd}$ GR, as illustrated in FIG. 2B) 242 are floating guard rings which have floating voltage in termination area 245, wherein the first type guard ring 239 and the second type guard rings 242 all have junction depths greater than the p body region 246. Moreover, the first type guard ring 239 is connected with a N third doped column region 238' having about half column width of the N first doped column region 238 and a P type doped column region 237' having about same column width as the P second doped column region 237 through the p body region 246.

Figure 3:
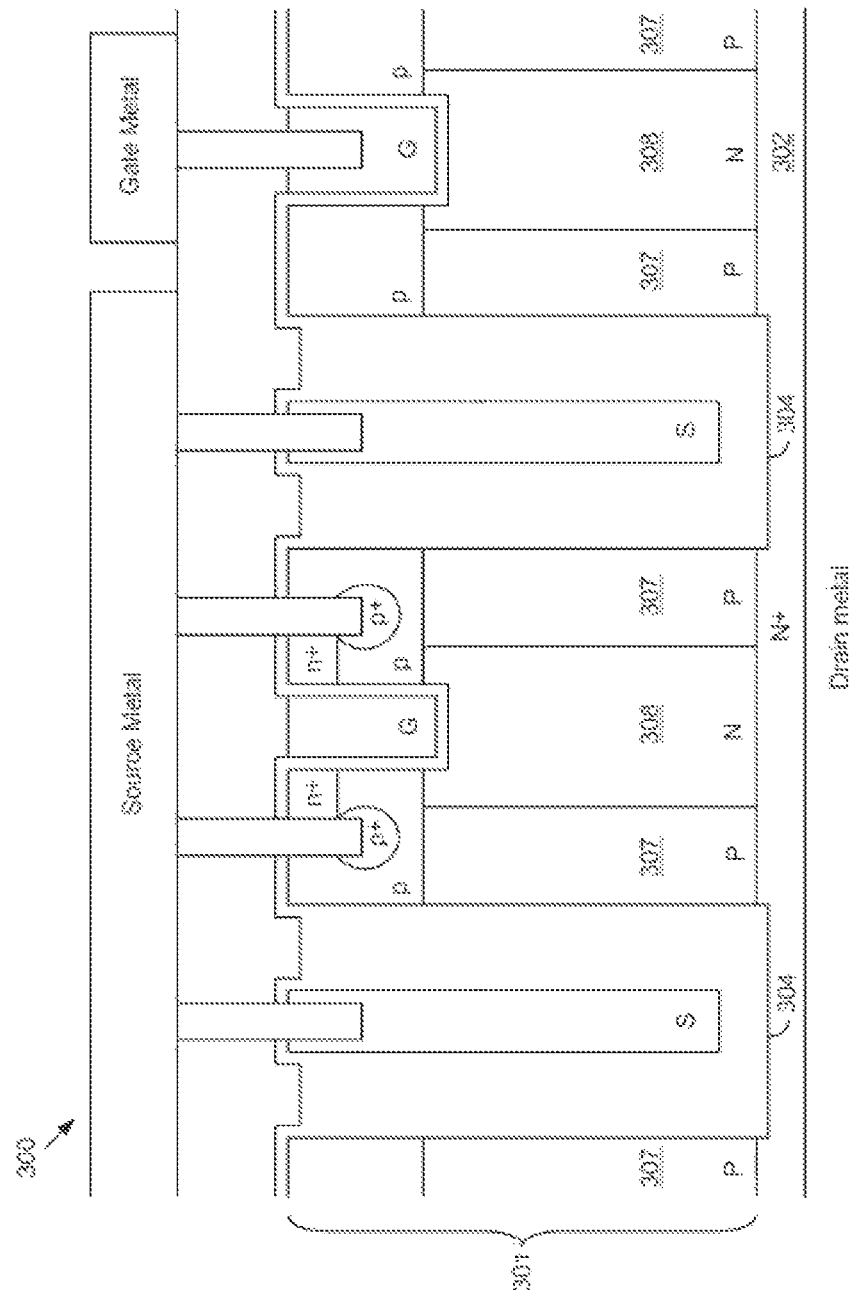
FIG. 3 is a cross-sectional view of another preferred embodiment according to the present invention.

FIG. 3 shows a cross-sectional view of another preferred N-channel super-junction trench MOSFET 300 according to the present invention, which is similar to the super-junction trench MOSFET 200 in FIG. 2A except that, in FIG. 3, the deep trenches 304 starting from a top surface of the N-epitaxial layer 301 is penetrate through the N– epitaxial layer 301 and further extending into N+ substrate 302. Besides, column bottoms of the first doped column region 308 and the second doped column regions 307 reach the interface between the N– epitaxial layer 301 and the N+ substrate 302.

Figure 4:
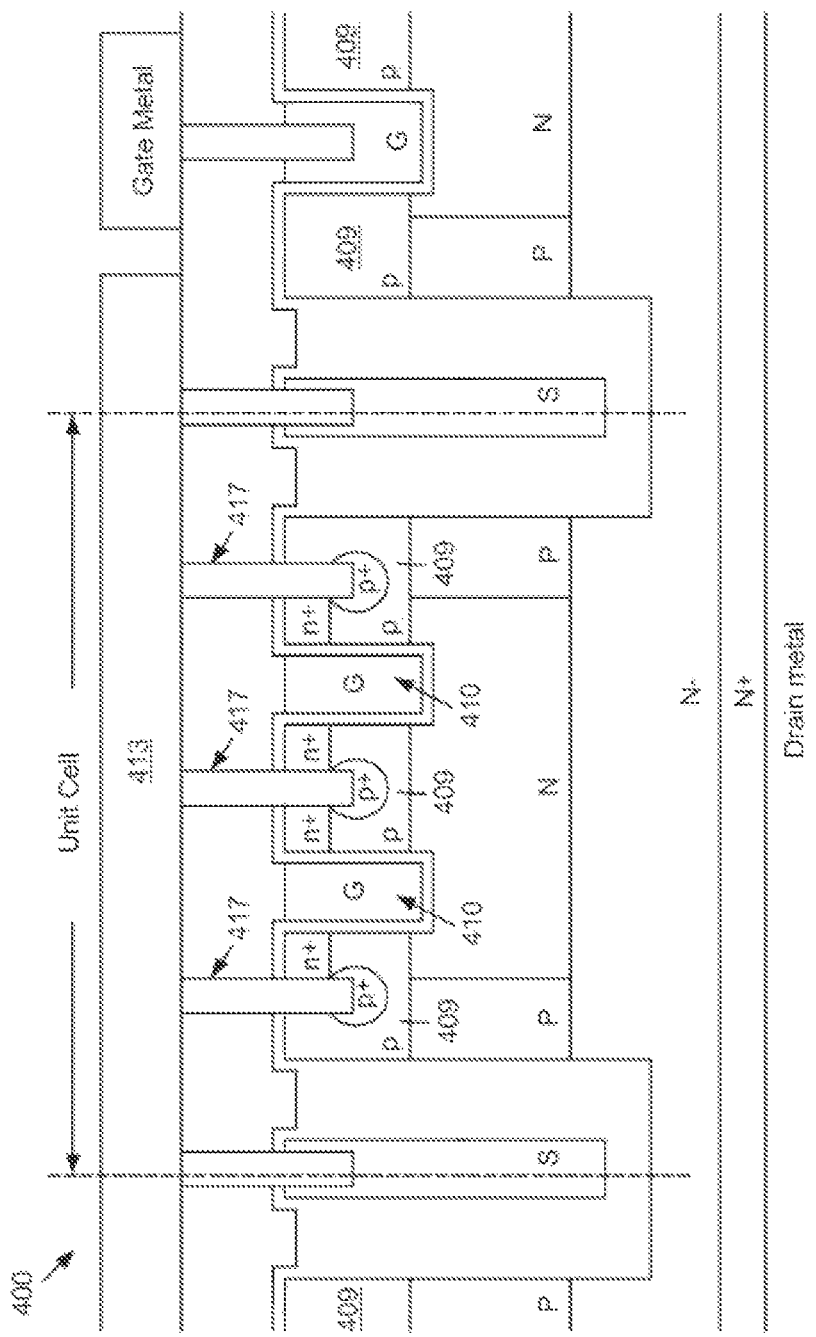
FIG. 4 is a cross-sectional view of another preferred embodiment according to the present invention.

FIG. 4 shows a cross-sectional view of another preferred N-channel super-junction trench MOSFET 400 according to the present invention, which is similar to the super-junction trench MOSFET 200 in FIG. 2A except that, in FIG. 4, there are multiple trenched gates 410 formed in each unit cell for further Rds reduction due to less channel resistance, and for ESD capability enhancement due to larger capacitance. And as shown in FIG. 4, each part of the p body region 409 is connected to the source metal 413 of the MOSFET 400 via a trenched source-body contact 417.

Figure 5:
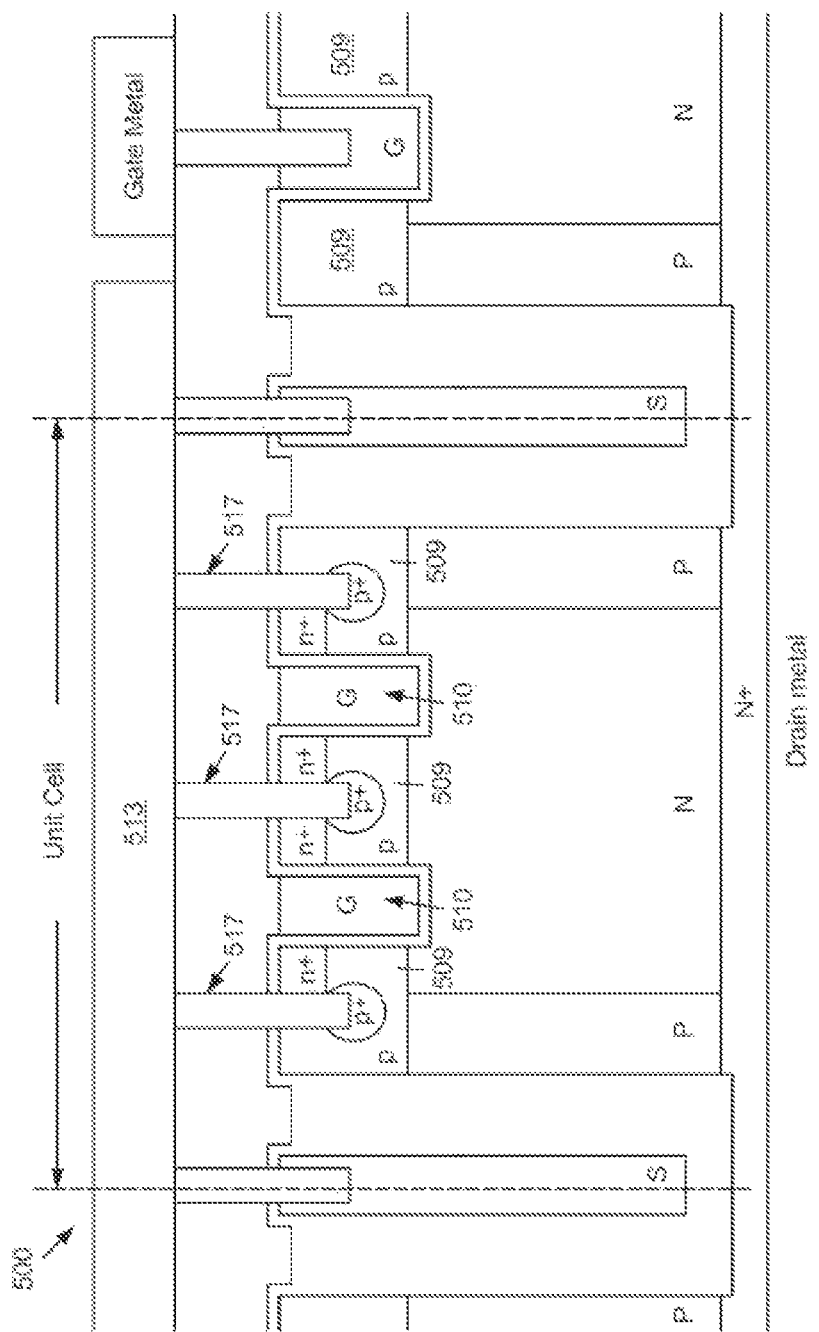
FIG. 5 is a cross-sectional view of another preferred embodiment according to the present invention.

FIG. 5 shows a cross-sectional view of another preferred N-channel super-junction trench MOSFET 500 according to the present invention, which is similar to the super-junction trench MOSFET 300 in FIG. 3 except that, in FIG. 5, there are multiple trenched gates 510 formed in each unit cell for further Rds reduction due to less channel resistance, and for ESD capability enhancement due to larger capacitance. And as shown in FIG. 5, each part of the p body region 509 is connected to the source metal 513 of the MOSFET 500 via a trenched source-body contact 517.

Figure 6:
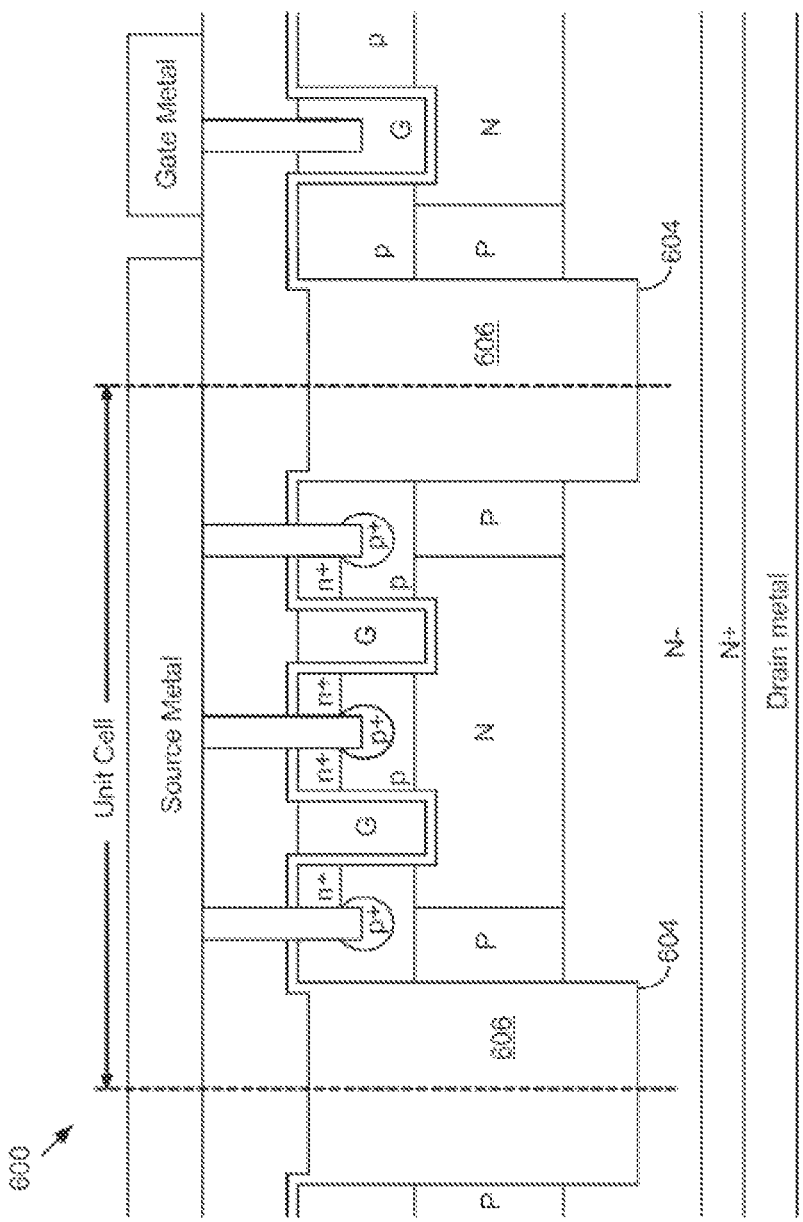
FIG. 6 is a cross-sectional view of another preferred embodiment according to the present invention.

FIG. 6 shows a cross-sectional view of another preferred N-channel super-junction trench MOSFET 600 according to the present invention, which is similar to FIG. 4 except that, in FIG. 6, the deep trenches 604 are only filled with the thick dielectric layer 606 without having shielded electrodes.

Figure 7:
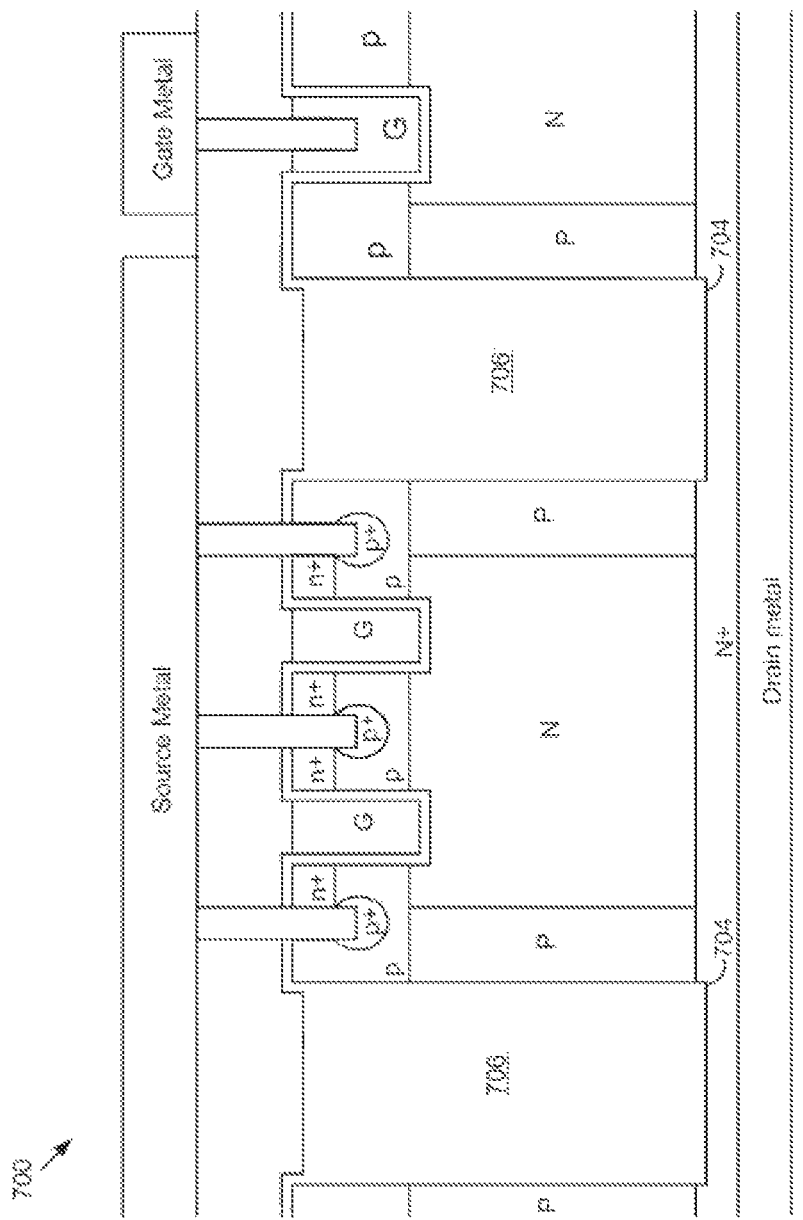
FIG. 7 is a cross-sectional view of another preferred embodiment according to the present invention.

FIG. 7 shows a cross-sectional view of another preferred N-channel super-junction trench MOSFET 700 according to the present invention, which is similar to FIG. 5 except that, in FIG. 7, the deep trenches 704 are only filled with the thick dielectric layer 706 without having shielded electrodes.

Figure 8:
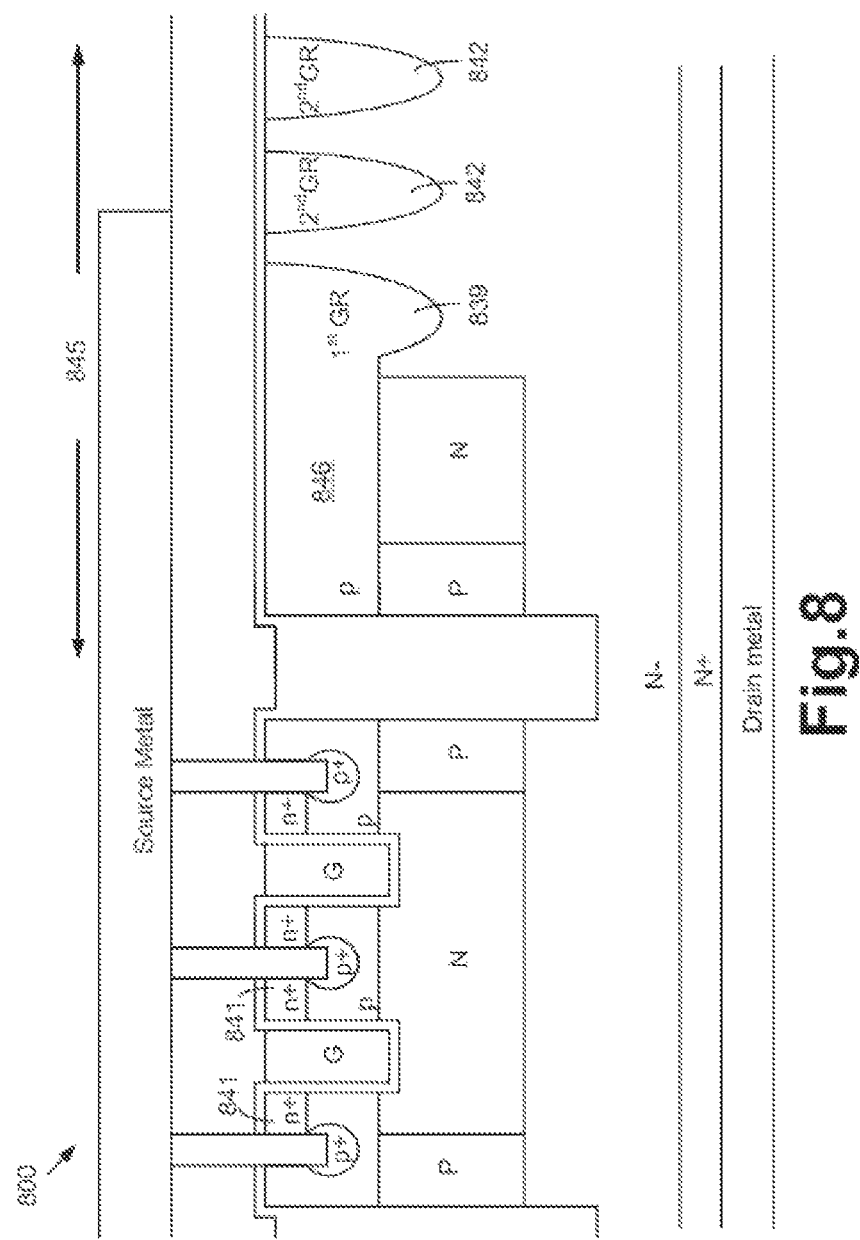
FIG. 8 is a cross-sectional view of another preferred embodiment according to the present invention.

FIG. 8 shows a cross-sectional view of another preferred super junction trench MOSFET 800 according to the present invention which has a similar structure as the super-junction trench MOSFET 600 in FIG. 6, except that, N-channel trench MOSFET 800 in FIG. 8 further comprises a termination area 845 including multiple guard rings, among which a first type guard ring 839 (1$^{st}$ GR, as illustrated in FIG. 8) is connected with the n+ source region 841, and second type guard rings (2$^{nd}$ GR, as illustrated in FIG. 8) 842 are floating guard rings which have floating voltage in termination area 845, wherein the first type guard ring 839 and the second type guard rings 842 all have junction depths greater than the p body region 846.

Figure 9:
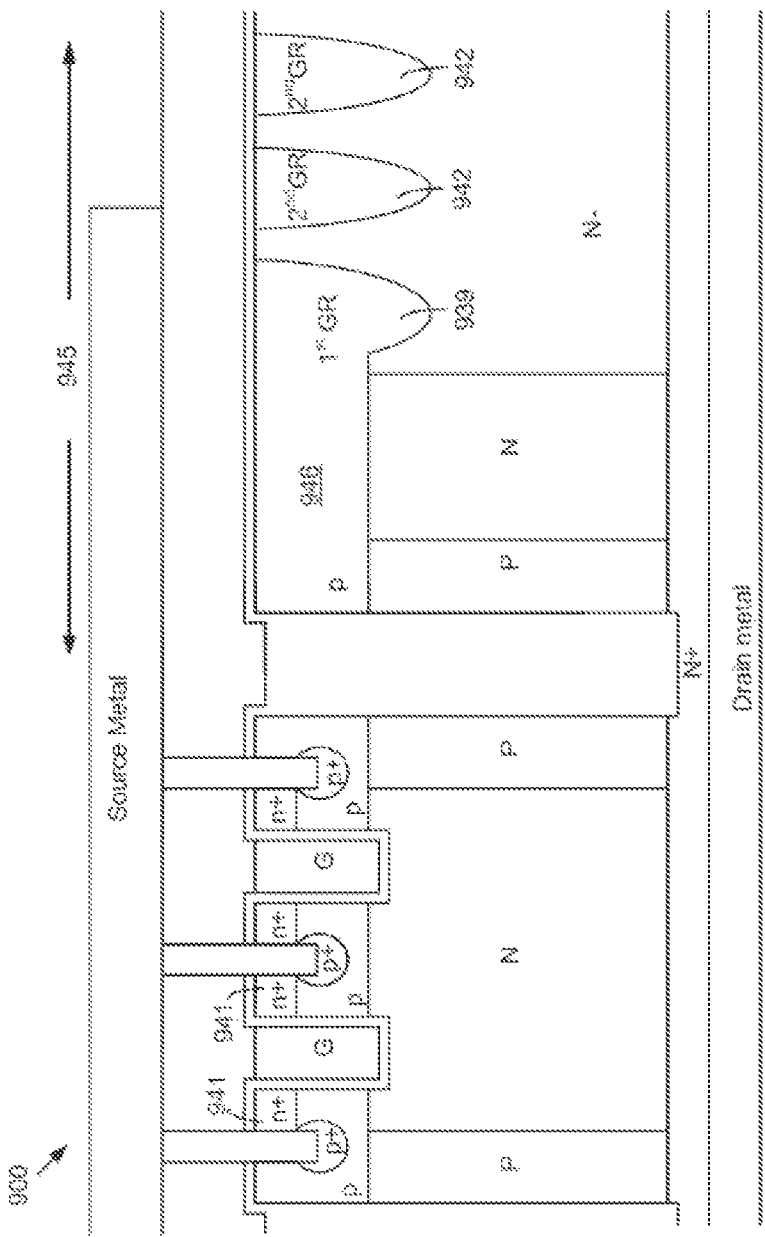
FIG. 9 is a cross-sectional view of another preferred embodiment according to the present invention.

FIG. 9 shows a cross-sectional view of another preferred super-junction trench MOSFET 900 according to the present invention which has a similar structure as the super-junction trench MOSFET 700 in FIG. 7, except that, N-channel trench MOSFET 900 in FIG. 9 further comprises a termination area 945 including multiple guard rings, among which a first type guard ring 939 (1$^{st}$ GR, as illustrated in FIG. 9) is connected with the n+ source region 941, and second type guard rings (2$^{nd}$ OR, as illustrated in FIG. 9) 942 are floating guard rings which have floating voltage in termination area 945, wherein the first type guard ring 939 and the second type guard rings 942 all have junction depths greater than the p body region 946.

Figure 10:
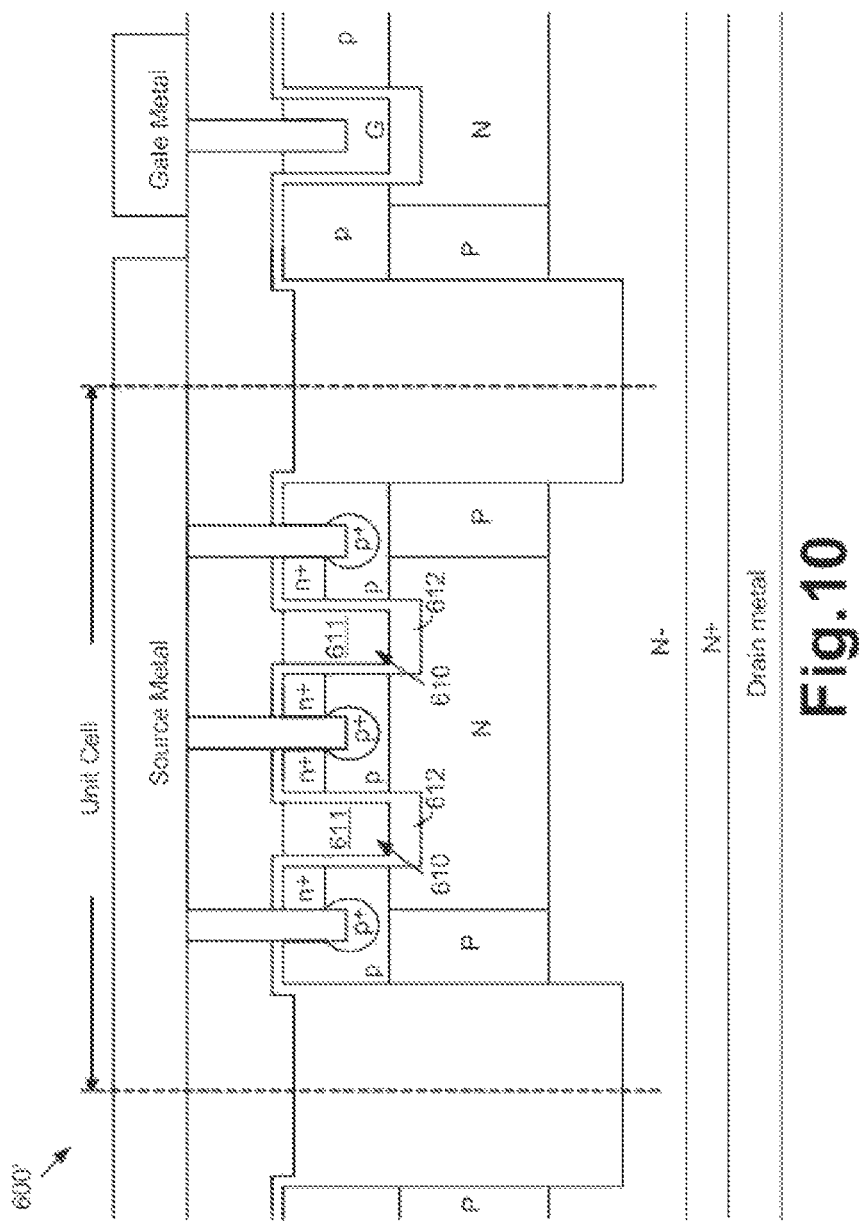
FIG. 10 is a cross-sectional view of another preferred embodiment according to the present invention.

FIG. 10 shows a cross-sectional view of another preferred N-channel super junction trench MOSFET 600' according to the present invention which has a similar structure as the super-junction trench MOSFET 600 in FIG. 6 except that, in FIG. 10, each the trenched gate 610 comprises a doped polysilicon layer 611 padded by a gate oxide layer 612, wherein the gate oxide layer 612 has a greater thickness along bottom of each the trenched gate 610 than along sidewalls of each the trenched gate 610. However in FIG. 6, the gate oxide layer has thickness along bottom of each the trenched gate equal to or thinner than along sidewalls of each the trenched gate.

Figure 11:
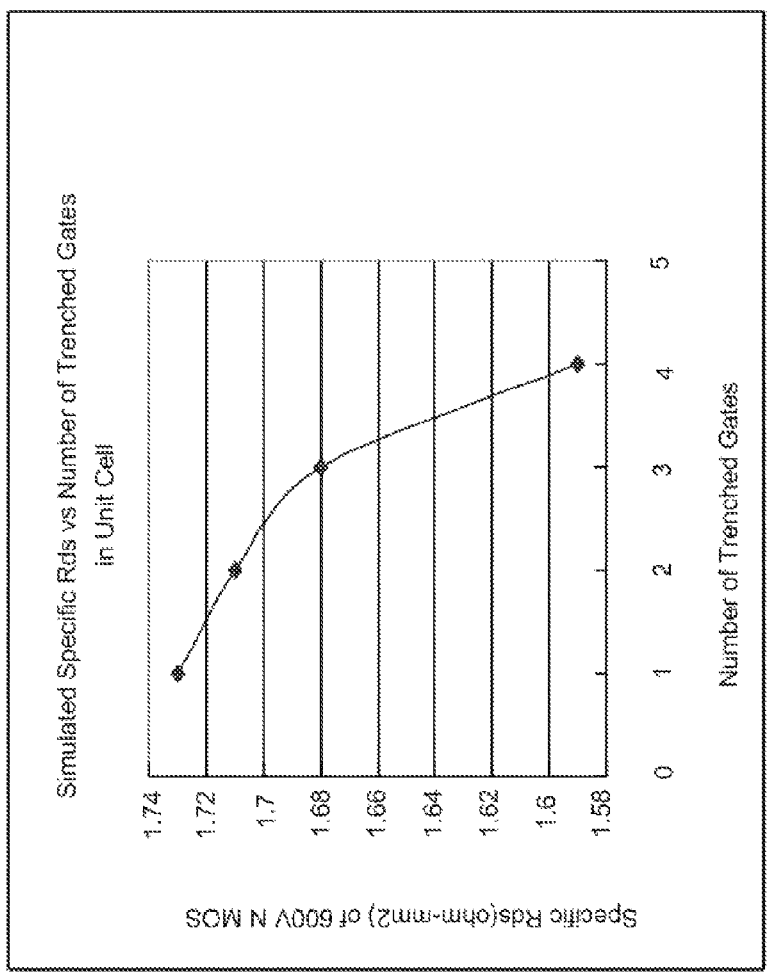
FIG. 11 is a diagram showing the relationship between simulated specific Rds and number of the trenched gates in unit cell.

FIG. 11 shows the relationship between simulated specific Rds and number of trenched gates ranging from one to four, from the diagram it can be seen that, in unit cell, the simulated specific Rds decreases with increasing trenched gates number.

Figure 12B:
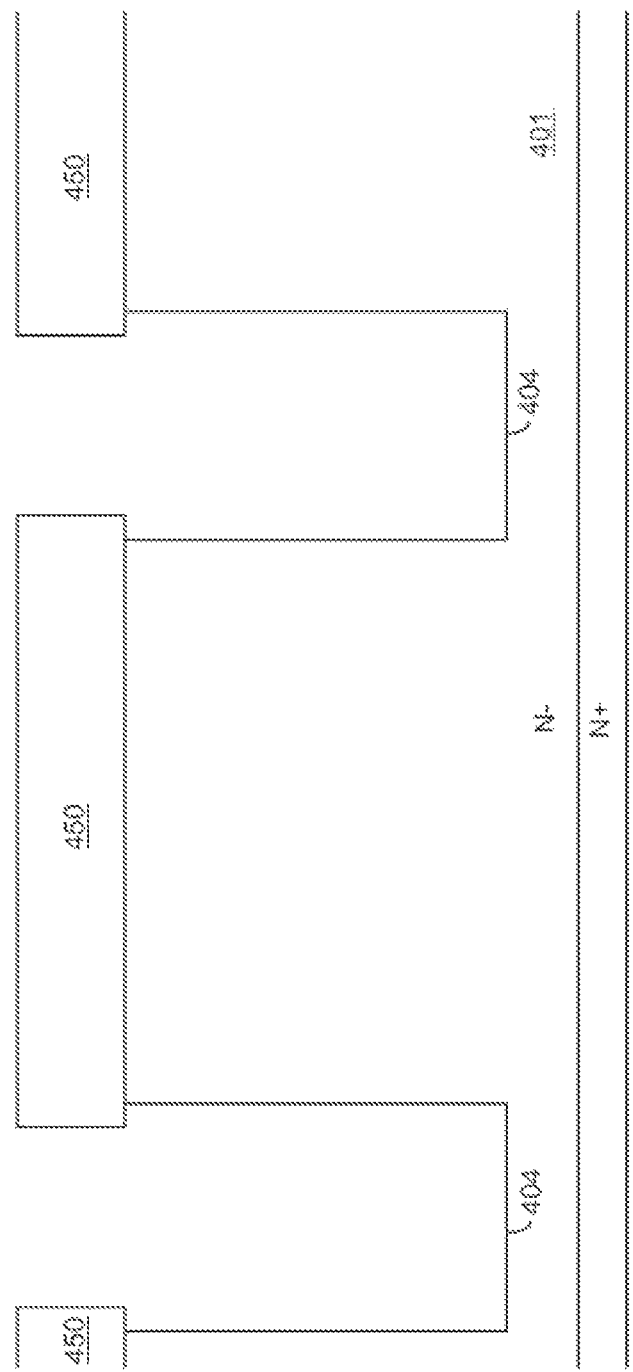

FIGS. 12A to 12L are a serial of exemplary steps that are performed to form a unit cell of the inventive super-junction trench MOSFET 400 in FIG. 4. In FIG. 12A, an N– epitaxial layer 401 is grown on an N+ substrate 402, wherein the N+ substrate 402 has a higher doping concentration than the N– epitaxial layer 401, and shares a common interface with the N– epitaxial layer 401. Next, a hard mask 450, which can be implemented by using an oxide layer, is formed covering a top surface of the N– epitaxial layer 401. Then, after a trench mask (not shown) is applied onto the hard mask 450, a pair of deep trenches 404 are etched through the hard mask 450 and into the N– epitaxial layer 401 or through the epitaxial layer 401 and into the substrate 402 by successively dry oxide etch and dry silicon etch.

In FIG. 12B, an isotropic dry silicon etch in down stream plasma is carried out to eliminate the plasma damage introduced during opening the deep trenches 404. The hard mask 450 is still remained to block sequential angle ion implantation into the top surface of the N– epitaxial layer 401.

In FIG. 12C, a pad oxide 452 of about 100 angstroms in thickness is grown along inner surfaces of the deep trenches 404. Then, an angle ion implantation of Phosphorus dopant followed by a Phosphorus dopant drive-in step is carried out to form an N first doped column region 403 in a mesa between sidewalls of the deep trenches 404.

Figure 12E:
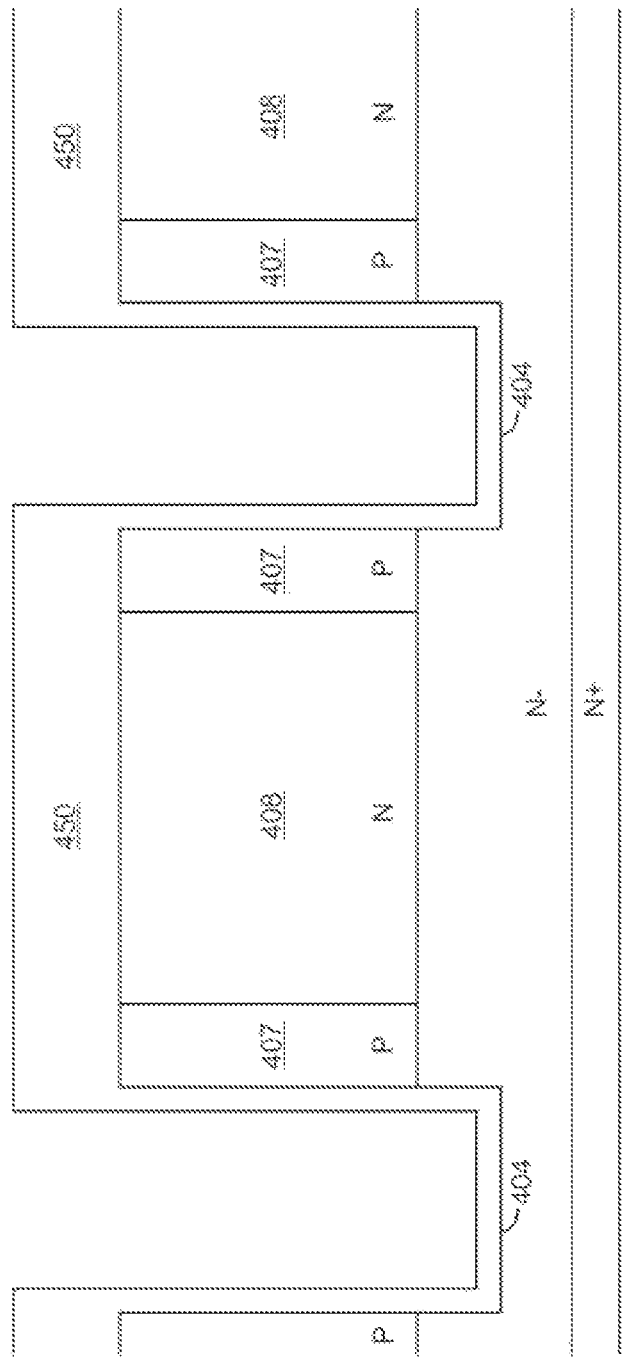

In FIG. 12D, another angle ion implantation of Boron dopant is carried out and followed by a Boron dopant diffusion step as shown in FIG. 12E to form a pair of P second doped column regions 407 with column shape adjacent to the sidewalls of the deep trenches 404, in parallel with and surrounding the N first doped column region 408.

Figure 12F:
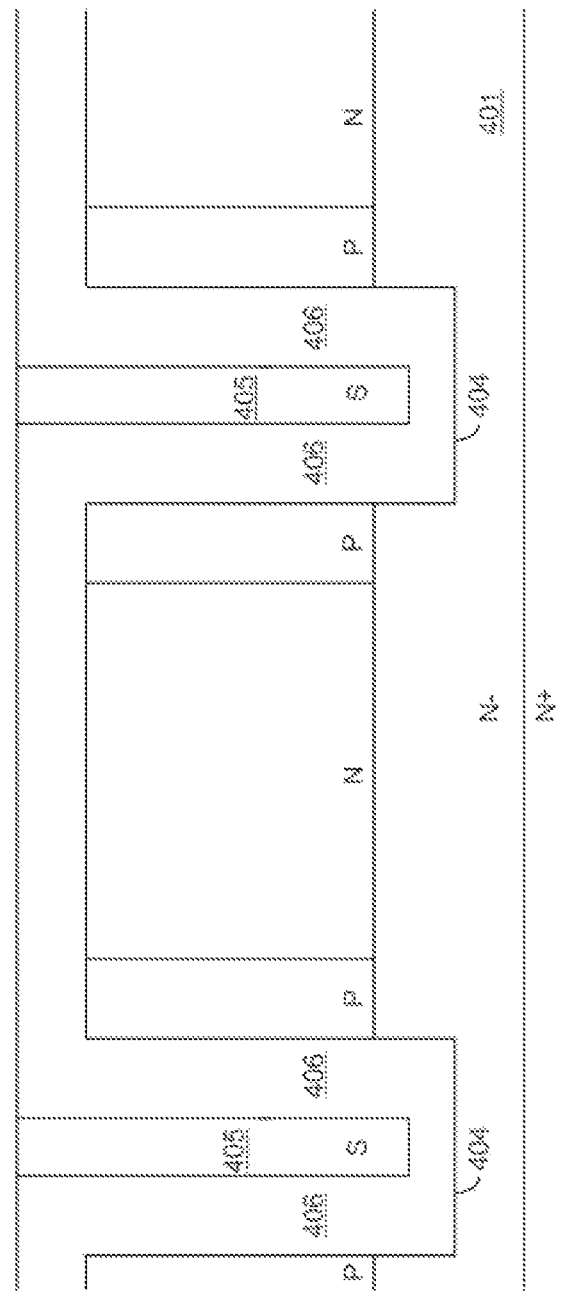

In FIG. 12F, the hark mask 450 (as shown in FIG. 12E) and the pad oxide 452 (as shown in FIG. 12C) are removed away. A thick dielectric layer 406 is formed lining the inner surfaces of the deep trenches 404 and covering the top surface of the N− epitaxial layer 401 by thick dielectric deposition. Then, a doped poly-silicon layer 405 is deposited onto the thick dielectric layer 406 to fill the deep trenches 404 and is then removed from the top surface of the N− epitaxial layer 401 by poly-silicon CMP or dry etch.

Figure 12G:
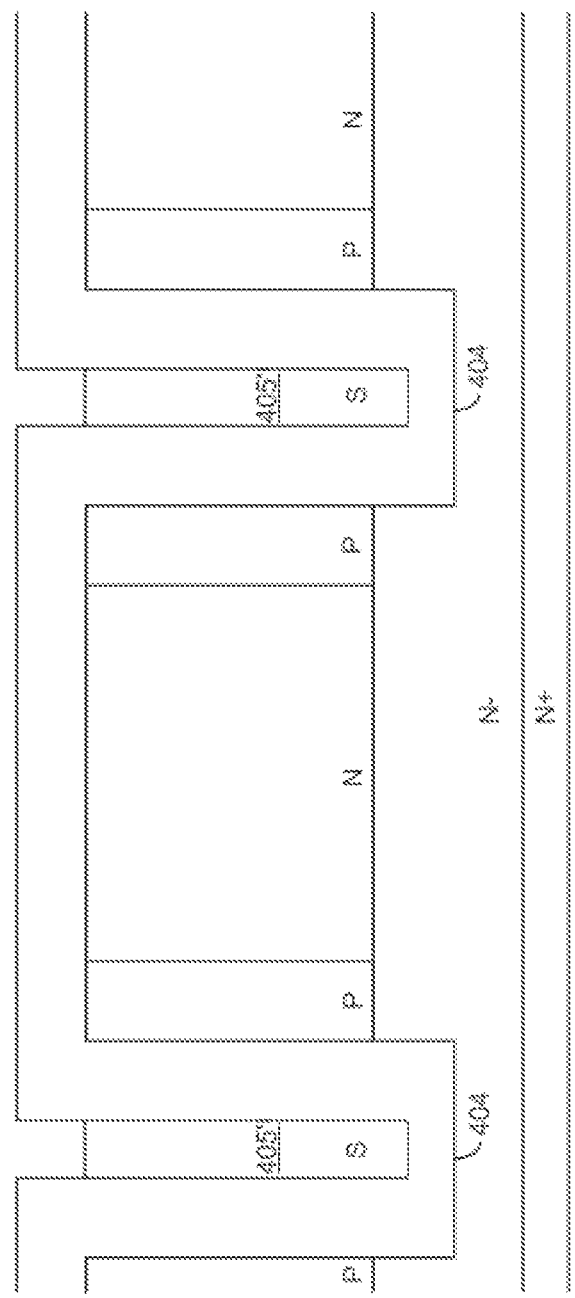

In FIG. 12G, the doped poly-silicon layer 405 is recessed to serve as a shielded electrode 405' within each of the deep trenches 404.

Figure 12H:
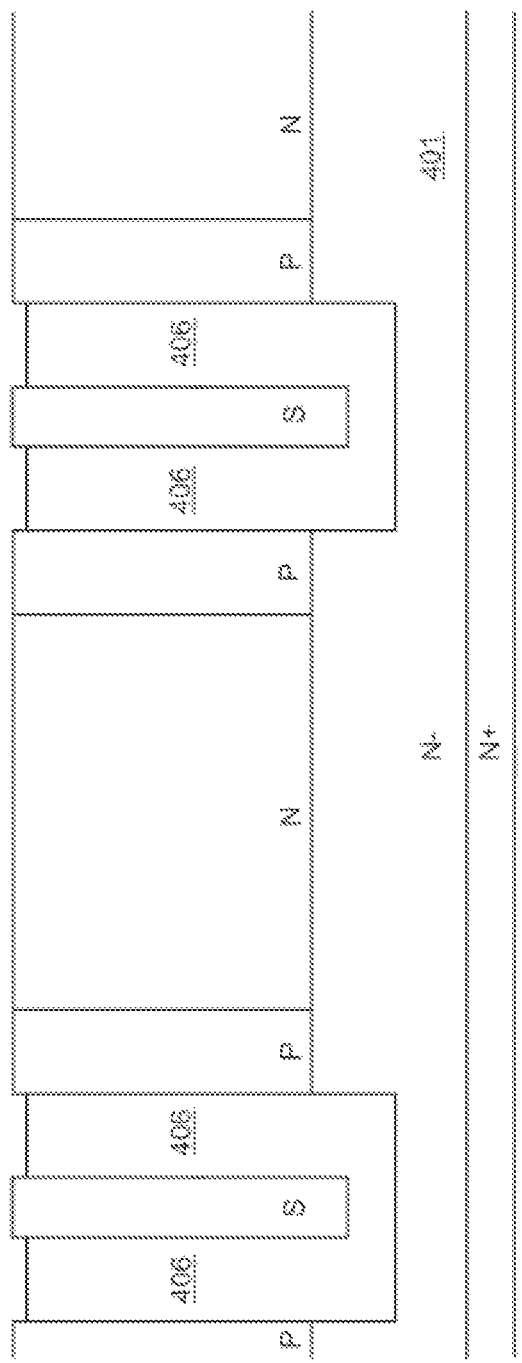

In FIG. 12H, the thick dielectric layer 406 is etched back from the top surface of the N− epitaxial layer 401.

As alternative, the steps of FIGS. 12F, 12G and 12H can be performed by only forming a thick dielectric layer filling into the deep trenches and covering the top surface of the N− epitaxial layer, and then etching back or CMP the thick dielectric layer from the top surface of the N− epitaxial layer.

In FIG. 12I, after applying a gate trench mask (not shown), a plurality of gate trenches 453 and at least one wide gate trench 454 which has a trench width greater than the gate trenches 453 are etched into the N first doped column region 408. Afterwards, a sacrificial oxide (not shown) is grown and then removed to eliminate the plasma damage introduced during opening the gate trenches. Then, a gate oxide layer 412 is grown along inner surfaces of the gate trenches 453 and the wide gate trench 454. Then, another doped poly-silicon layer is deposited to fill the gate trenches 453 and the wide gate trench 454, and then is etched back by CMP or plasma etch to serve as gate electrodes 411.

Figure 12J:
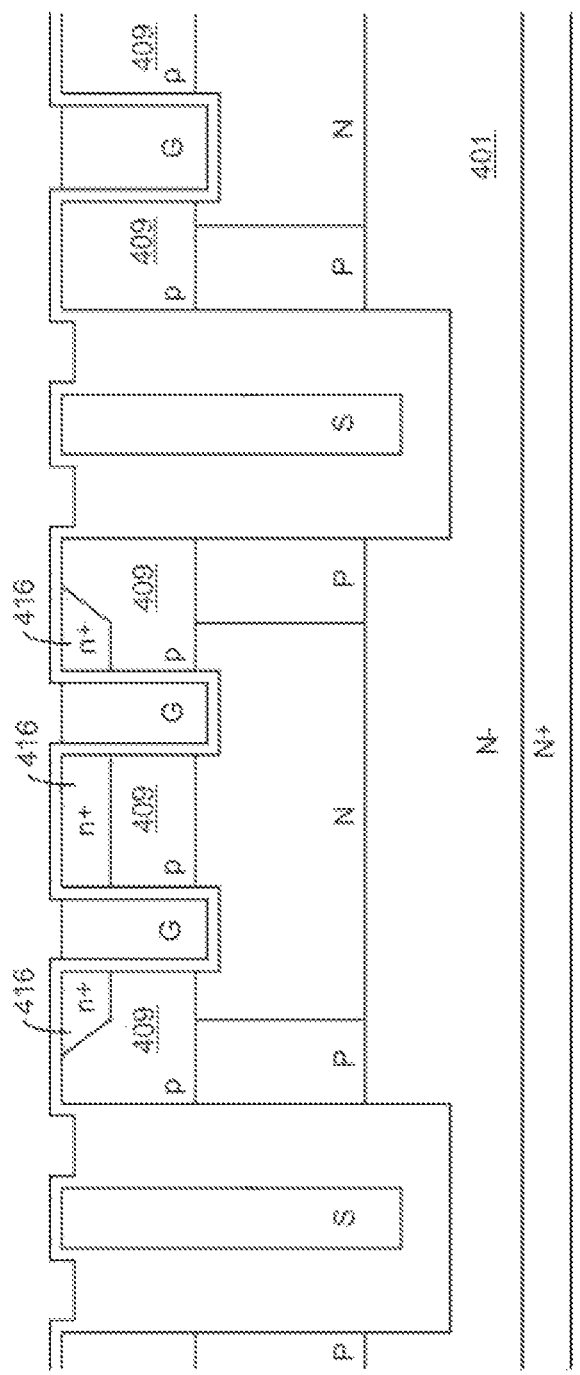

In FIG. 12J, after applying a guard ring mask (not shown) onto the top surface of the N− epitaxial layer 401, a guard ring ion implantation is carried out and followed by a diffusion step to form multiple guard rings in a termination area (not shown). Then, after applying a body mask (not shown), an ion implantation of p type dopant is carried out and followed by diffusion to form p body regions 409. Then, after removing the body mask and applying a source mask (not shown), an ion implantation of n type dopant and a diffusion step are carried out to form n+ source regions 416 near a top surface of the p body regions 409, and the n+ source regions 416 have a higher doping concentration than the epitaxial layer 401.

Figure 12K:
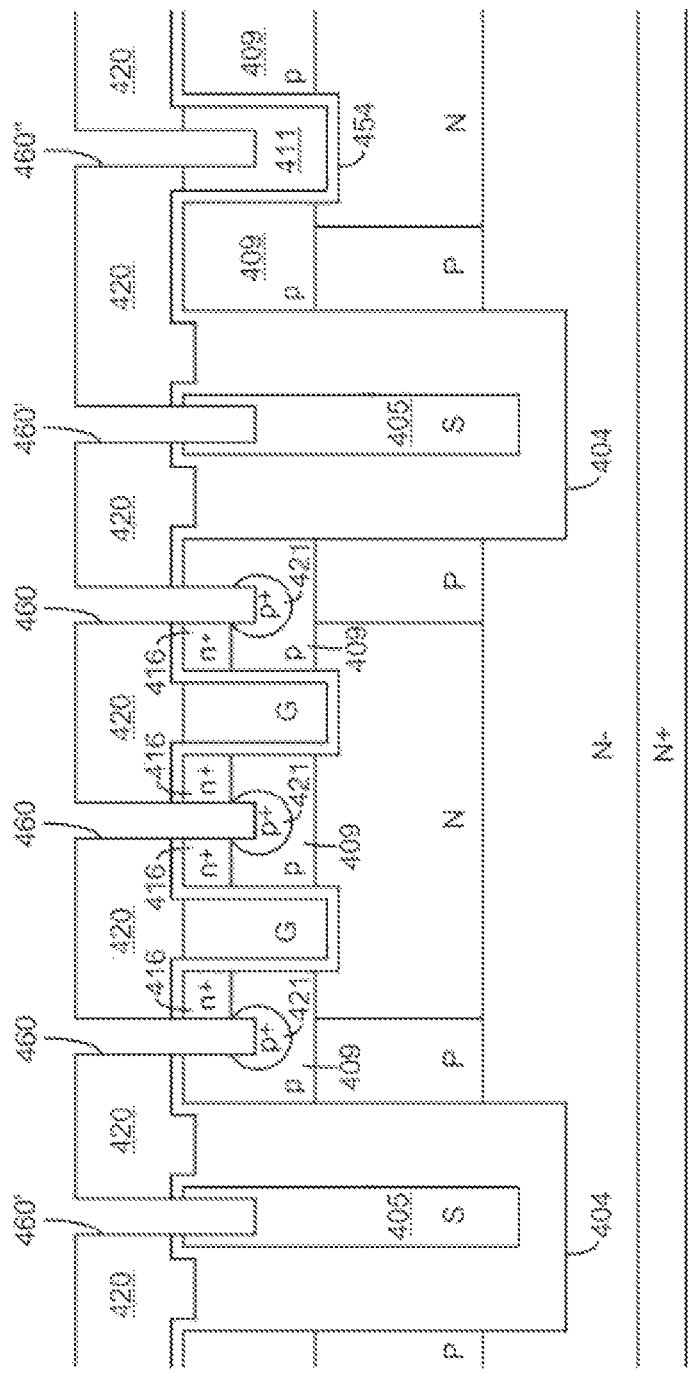

In FIG. 12K, an insulation layer is deposited onto a whole top surface of the device structure to serve as a contact interlayer 420. Then, after applying a contact mask (not shown) onto the contact interlayer 420, a plurality of contact holes are formed by successively dry oxide etch and dry silicon etch. After penetrating through the contact interlayer 420, the contact holes 460 are further penetrating through the n+ source regions 416 and extending into the p body regions 409 in the mesa, the contact holes 460' are extending into the shielded electrodes 405 in the deep trenches 404, and the contact hole 460" is extending into the gate electrode 411 in the wide gate trench 454. Next, a 13F2 ion implantation is performed to form a plurality of p+ body contact regions 421 within the p body regions 409 and surrounding at least bottoms of the contact holes 460.

Figure 12L:
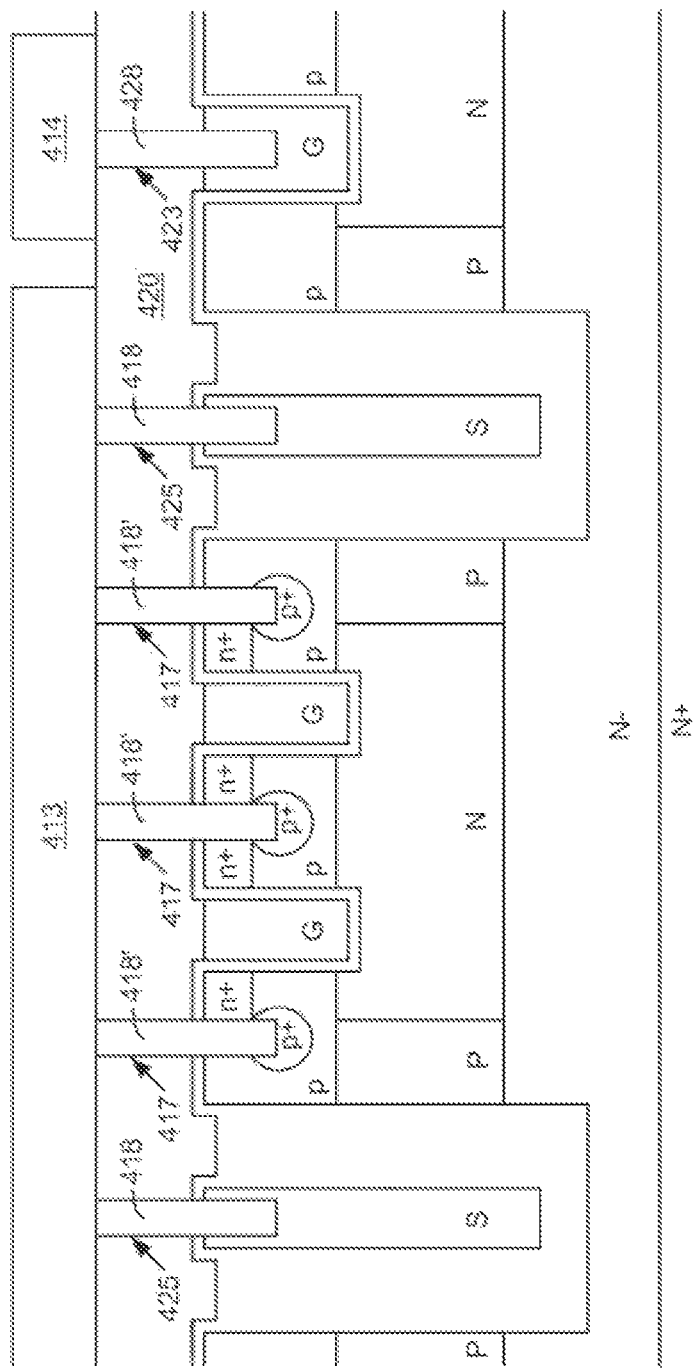

In FIG. 12L, a barrier metal layer Ti/TiN or Co/TiN or Ti/TiN is deposited on sidewalls and bottoms of all the contact holes followed by a step of RTA (Rapid Thermal Annealing) process for silicide formation. Then, a tungsten material layer is deposited onto the barrier metal layer, wherein the tungsten material layer and the barrier metal layer are then etched back to form: contact metal plugs 418 for trenched source contacts 425; contact metal plugs 418' for trenched source-body contacts 417; and contact metal plug 428 for trenched gate contact 423. Then, a metal layer of Al alloys or Cu padded by a resistance-reduction layer Ti or Ti/TiN underneath is deposited onto the contact interlayer 420 and followed by a metal etching process by employing a metal mask (not shown) to form a source metal 413 and a gate metal 414.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A super-junction trench MOSFET comprising a plurality of unit cells with each unit cell in an active area comprising:
    a substrate of a first conductivity type;
    an epitaxial layer of said first conductivity type grown on said substrate, said epitaxial layer having a lower doping concentration than said substrate;
    a pair of deep trenches starting from a top surface of said epitaxial layer and down extending into said epitaxial layer;
    a mesa between said pair of deep trenches;
    a first doped column region of the first conductivity type with column shape within each said mesa;
    a pair of second doped column regions of a second conductivity type with column shape adjacent to sidewalls of said pair of deep trenches within each said mesa, in parallel with and surrounding said first doped column region;
    a body region of the second conductivity type in each said mesa, covering a top surface of said first and second doped column regions, extending between said pair of deep trenches;
    at least one trenched gate starting from the top surface of said epitaxial layer and down penetrating through said body region and extending into said first doped column in each said mesa, each said trenched gate comprising a gate electrode padded by a gate oxide layer;
    multiple trenched source-body contacts with each filled with contact metal plug extending into said body region in each said mesa; and
    a source region of said first conductivity type surrounding an upper portion of each said trenched gate, extending between the upper portion of each said trenched gate and sidewalls of adjacent trenched source-body contacts.

2. The super-junction trench MOSFET of claim 1, wherein trench bottoms of said deep trenches is above said substrate.

3. The super-junction trench MOSFET of claim 1, wherein said deep trenches further extend into said substrate, and said first doped column region and said second doped column regions reaching a common interface between said substrate and said epitaxial layer.

4. The super-junction trench MOSFET of claim 1 further comprising a body contact region of the second conductivity type within said body region and surrounding at least bottom of each of said multiple trenched source-body contacts, wherein said body contact region has a higher doping concentration than said body region.

5. The super-junction trench MOSFET of claim 1 further comprising a first type guard ring connected with said source region, and multiple second type guard rings having floating voltage in a termination area, wherein said first type guard ring and said multiple second type floating guard rings all have junction depths greater than said body region; and said first type guard ring is connecting with a third doped column region of said first conductivity type and a fourth doped column region of said second conductivity type through a body region wherein said third doped column region having about half column width of said first doped column region and said fourth doped column region having about same column width as said second doped column region in said unit cell.

6. The super-junction trench MOSFET of claim 1, wherein each of said contact metal plug is a tungsten plug padded by a barrier metal layer of Ti/TiN or Co/TiN or Ta/TiN.

7. The super-junction trench MOSFET of claim 1 further comprising at least one trenched gate for gate connection which is connected to a gate metal via a trenched gate contact filled with said contact metal plug.

8. The super-junction trench MOSFET of claim 1 further comprising a thick dielectric layer along an inner surface of each of said deep trenches; and a shielded electrode filling into each of said deep trenches and close to said thick dielectric layer, wherein said shielded electrode is connected to a source metal via a trenched source contact filled with said contact metal plug.

9. The super-junction trench MOSFET of claim 1 further comprising a thick dielectric layer filled into each of said deep trenches.

10. The super-junction trench MOSFET of claim 1 wherein said gate oxide layer has oxide thickness on trench gate bottom equal to or thinner than trench gate sidewall.

11. The super-junction trench MOSFET of claim 1 wherein said gate oxide layer has oxide thickness on trench gate bottom thicker than trench gate sidewall.

* * * * *